United States Patent
Sasaki et al.

(10) Patent No.: US 10,343,893 B2
(45) Date of Patent: Jul. 9, 2019

(54) LOW FRICTION COATING FORMED OF BORON-DOPED ZINC OXIDE THIN FILM AND MICROMACHINE

(71) Applicant: NATIONAL INSTITUTE FOR MATERIALS SCIENCE, Tsukuba-shi, Ibaraki (JP)

(72) Inventors: Michiko Sasaki, Ibaraki (JP); Masahiro Goto, Ibaraki (JP); Akira Kasahara, Ibaraki (JP); Masahiro Tosa, Ibaraki (JP)

(73) Assignee: NATIONAL INSTITUTE FOR MATERIALS SCIENCE, Ibaraki (JP)

( * ) Notice: Subject to any disclaimer, the term of this patent is extended or adjusted under 35 U.S.C. 154(b) by 92 days.

(21) Appl. No.: 15/576,376

(22) PCT Filed: May 25, 2016

(86) PCT No.: PCT/JP2016/065521
§ 371 (c)(1),
(2) Date: Nov. 22, 2017

(87) PCT Pub. No.: WO2016/190375
PCT Pub. Date: Dec. 1, 2016

(65) Prior Publication Data
US 2018/0155183 A1  Jun. 7, 2018

(30) Foreign Application Priority Data

May 26, 2015  (JP) .................................. 2015-105970

(51) Int. Cl.
*B81B 3/00* (2006.01)
*B81B 7/02* (2006.01)
(Continued)

(52) U.S. Cl.
CPC .......... *B81B 3/0005* (2013.01); *B81B 3/0078* (2013.01); *B81B 7/02* (2013.01);
(Continued)

(58) Field of Classification Search
CPC ......... B81B 3/005; B81B 3/0078; B81B 7/02; C07B 7/02; B81C 2201/0119;
(Continued)

(56) References Cited

U.S. PATENT DOCUMENTS 4,336,120 A * 6/1982 Sakakura .............. C03C 17/245
                                                          204/192.15
2014/0193172 A1  7/2014 Tawada et al.

FOREIGN PATENT DOCUMENTS

| JP | 2004-52022 | 2/2004 |
|----|------------|--------|
| JP | 2007-154315 | 6/2007 |
| JP | 2014-152387 | 8/2014 |

OTHER PUBLICATIONS

Notification of Reasons for Refusal dated Dec. 26, 2018 in corresponding Japanese Patent Application No. 2017-520794 with machine translation.

(Continued)

*Primary Examiner* — James C Goloboy
(74) *Attorney, Agent, or Firm* — Wenderoth, Lind & Ponack, L.L.P.

(57) ABSTRACT

Low friction coating of the present invention includes a boron-doped zinc oxide thin film, wherein piezoelectric polarization in a vertical direction perpendicular to a film surface and a lateral direction horizontal to the film surface occurs and a magnitude of the piezoelectric polarization in the vertical direction is within 150 pm and a magnitude of the piezoelectric polarization in the lateral direction is within (Continued)

SHAPE IMAGE AND PFM IMAGE OF B-DOPED ZnO THIN FILM 100 pm at 90% or more of measurement points. This makes it possible to greatly decrease the friction in a nanometer order.

3 Claims, 7 Drawing Sheets

(51) Int. Cl.
 *C23C 14/08* (2006.01)
 *C23C 14/35* (2006.01)
 *C10M 103/06* (2006.01)
(52) U.S. Cl.
 CPC ............ *C10M 103/06* (2013.01); *C23C 14/08* (2013.01); *C23C 14/086* (2013.01); *C23C 14/35* (2013.01); *B81B 2201/035* (2013.01); *B81C 2201/0119* (2013.01); *B81C 2201/0181* (2013.01); *C10M 2201/0623* (2013.01)
(58) Field of Classification Search
 CPC ......... B81C 2201/0181; C10M 103/06; C10M 2201/063; C23C 14/08; C23C 14/086; C23C 14/35
 See application file for complete search history.

(56) References Cited

OTHER PUBLICATIONS

Extended European Search Report dated Feb. 12, 2019 in corresponding European Patent Application No. 16800079.2.

Sasaki et al., "Friction Characteristics of Boron-doped ZnO Thin Films Prepared by Combinatorial Sputtering Method", 53rd Annual Symposium of the Vacuum Society of Japan (ASVSJ-53) Proceedings, Nov. 14, 2012, p. 76, with machine translation.
Ambacher et al., "Two-dimensional electron gases induced by spontaneous and piezoelectric polarization charges in N- and Ga-face AlGaN/GaN heterostructures", Journal of Applied Physics, American Institute of Physics, US, vol. 85, No. 6, pp. 3222-3233, 1999.
International Search Report dated Aug. 30, 2016 in International Application No. PCT/JP2016/065521.
M. Goto, A. Kasahara, Y. Konishi, T. Oishi, M. Tosa and K. Yoshihara, "Frictional Property of Zinc Oxide Coating Films Observed by Lateral Force Microscopy", Jpn. J. Appl. Phys 42 (2003) 4834-4836.
M. Goto, A. Kasahara and M. Tosa, "Low frictional property of copper oxide thin films optimised using a combinatorial sputter coating system", Appl. Surf. Sci. 252[7] (2006) 2482-2487.
M. Goto, A. Kasahara and M. Tosa, "Reduction in Frictional Force of ZnO Coatings in a Vacuum", Jpn. J. Appl. Phys 47[12] (2008) 8914-8916.
M. Goto, A.Kasahara and M. Tosa, "Low-Friction Coatings of Zinc Oxide Synthesized by Optimization of Crystal Preferred Orientation", Tribology Letters, 43(2011)155-162.
Masahiro Goto, Akira Kasahara and Masahiro Tosa, "Combinatorial Sputter Coating System"—Sputtering apparatus capable of depositing multiple samples-, Convertech, 3, (2008) and its English machine translation.

* cited by examiner

SHAPE IMAGE AND PFM IMAGE OF B-DOPED ZnO THIN FILM

Fig. 5

LFM IMAGE OF B-DOPED ZnO THIN FILM

PFM IMAGE (VERTICAL DIRECTION) OF B-DOPED ZnO THIN FILM

LOW FRICTION COATING FORMED OF BORON-DOPED ZINC OXIDE THIN FILM AND MICROMACHINE

TECHNICAL FIELD

The present invention relates to low friction coating formed of a boron (B)-doped zinc oxide thin film. In particular, it relates to low friction coating formed of a B-doped zinc oxide thin film which is polarized almost uniformly in both directions of a direction perpendicular to the film surface and a direction parallel to the film surface and exhibits friction decreased to a nanometer order. The present invention also relates to a micromachine using such low friction coating.

BACKGROUND ART

The expectation for the development of energy saving technology by controlling the frictional force has increased as the global environmental and energy problems get worse. For example, as a familiar example, there are a large number of drive units in the interior of an apparatus such as a generator, and energy loss due to friction occurs at the respective places thereof. In order to suppress this problem, it is effective to decrease the friction between the materials.

Hitherto, there has been a technology to decrease the frictional force by coating the existing structural materials. The frictional property of this coating is greatly changed by changes in the crystal orientation, structure, and composition thereof, and thus how efficiently investigates the crystal orientation, structure, and composition which exhibit low frictional property in a short period of time has been the key to research and development.

As a material for performing such coating, it is desired to use resources which are abundant and inexpensive and have small environmental impacts. For example, the inventors of the present invention and the like have found out and disclosed that zinc oxide which is an oxide of zinc (Zn), one of metals satisfying this condition exhibits a low friction phenomenon when the crystal orientation thereof is optimized. In addition, zinc oxide is a piezoelectric material, and the inventors of the present invention and the like also have found that this piezoelectric property contributes to a decrease in friction (Patent Literature 1, Non Patent Literatures 1 to 4).

However, the specific mechanism of achieving low friction by piezoelectric property to be considered to affect the frictional property of ZnO coating has not yet been satisfactorily investigated.

In addition, the research and development of micromachines (also referred to as micro electro mechanical system (MEMS)) have been progressed in recent years. It has been found that the friction between mechanical members (for example, the friction between minute gears) in a micromachine greatly affects the mechanical performance of the micromachine. The size of the contact region between the mechanical members in a micromachine is in a nanometer order in some cases, and the friction occurring in such a region in a nanometer order is also often different from the macroscopic friction measured in the region in a millimeter order in facet. However, sufficient researches have not been carried out on the decrease in friction in the region in a nanometer order of zinc oxide coating.

CITATION LIST

Patent Literature

Patent Literature 1: JP 2004-52022 A

Non Patent Literature

Non Patent Literature 1: M. Goto, A. Kasahara, Y. Konishi, T. Oishi, M. Tosa and K. Yoshihara: Frictional Property of Zinc Oxide Coating Films Observed by Lateral Force Microscopy, Jpn. J. Appl. Phys 42 (2003) 4834-4836.

Non Patent Literature 2: M. Goto, A. Kasahara and M. Tosa: Low frictional property of copper oxide thin films optimized using a combinatorial sputter coating system, Appl. Surf. Sci. 252 [7] (2006) 2482-2487.

Non Patent Literature 3: M. Goto, A. Kasahara and M. Tosa: Reduction in Frictional Force of ZnO Coatings in a Vacuum, Jpn. J. Appl. Phys 47 [12] (2008) 8914-8916.

Non Patent Literature 4: M. Goto, A. Kasahara and M. Tosa: Low-Friction Coatings of Zinc Oxide Synthesized by Optimization of Crystal Preferred Orientation TRIBOLOGY LETTERS, 43 (2011) 155-162.

Non Patent Literature 5: Masahiro Goto, Akira Kasahara, and Masahiro Tosa, "Combinatorial sputter coating system—Sputtering apparatus capable of forming film on multiple samples", CONVERTECH Vol. 36, No. 3 (March, 2008) 88-91.

SUMMARY OF INVENTION

Technical Problem

An object of the present invention is to further decrease the friction of a zinc oxide thin film by clarifying the mode of the piezoelectric property of the zinc oxide thin film for lowering the friction, which has not been investigated in the prior art as described above.

Solution to Problem

According to one aspect of the present invention, there is provided Low friction coating consisting of a boron-doped zinc oxide thin film, wherein piezoelectric polarization in a vertical direction perpendicular to a surface of the film and a lateral direction horizontal to the surface of the film occurs and a magnitude of the piezoelectric polarization in the vertical direction is within 150 pm (picometer) and a magnitude of the piezoelectric polarization in the lateral direction is within 100 pm at 90% or more of measurement points.

In addition, according to another aspect of the present invention, there is provided a micromachine in which the low friction coating is applied to at least either of a movable member and another member in contact with the movable member.

Here, a size of a region in which the movable member and the other member are in contact may be from 1 nm to 200 µm.

Advantageous Effects of Invention

According to the present invention, since boron (B) is doped to the zinc oxide thin film and the piezoelectric polarization in the vertical and lateral directions to occur is respectively managed to be a certain value or less at 90% or more of the measuring points, it is possible to significantly decrease the frictional force in a nanometer order of the B-doped zinc oxide thin film. This makes it possible to decrease the friction in the interior of a device including fine working members such as micromachines, and this is greatly useful for the realization of this kind of device.

DESCRIPTION OF EMBODIMENTS

Hereinafter, the present invention will be described in detail with reference to embodiments.

As a result of intensive research by the inventors of the present invention, it has been found out that although the polarization of domains (crystal grains) constituting the zinc oxide thin film shows various facets depending on the film forming conditions, friction in the region at a nanometer level of the zinc oxide thin film decreases in a case in which the magnitude of polarization in each direction is managed to be a certain value or less at 90% or more of the measurement points as well as the zinc oxide thin film is polarized in both directions of a direction horizontal to the film surface and a direction perpendicular to the film surface by appropriately controlling the film forming conditions as well as adding boron (B) at the time of film formation, thereby completing the present invention to use a boron-doped zinc oxide thin film ($Zn_xO_y$/B (including x=y=1, B is doped)) having this property for low friction coating.

In other words, the low friction coating of the present invention is formed of a boron-doped zinc oxide thin film in which piezoelectric polarization in a vertical direction perpendicular to a film surface and a lateral direction horizontal to the film surface occurs and a magnitude of the piezoelectric polarization in the vertical direction is within 150 pm and a magnitude of the piezoelectric polarization in the lateral direction is within 100 pm at 90% or more of measurement points. Here, it is desirable that the number of measurement points is 60,000 or more.

In the B-doped zinc oxide thin film of the present invention, the composition ratio (mass ratio) of boron (B) is preferably from 5 to 30%. When the content of boron is in the above range, boron can contribute to a remarkable decrease in frictional force.

In the present specification, the term "low friction coating" means coating formed of a B-doped zinc oxide thin film having a frictional force decreased by 40% or more as compared to a zinc oxide thin film to which B is not doped by the addition of B.

In addition, the B-doped zinc oxide thin film includes both cases of a case in which the boron (B) atom itself is contained in a zinc oxide thin film and a case in which boron (B) is contained in a zinc oxide thin film as an oxide.

It has been found out that the friction in a nanometer order remarkably decreases in a case in which the magnitude of piezoelectric polarization in each direction is a certain value or less at 90% or more of the measurement points as well as piezoelectric polarization occurs in both directions of the vertical direction (direction perpendicular to the film surface of the coating) and the lateral direction (direction parallel to the film surface) of the B-doped zinc oxide coating. In order to realize such properties, in an embodiment of the present invention, a B-doped zinc oxide thin film is formed by doping boron (B) after adjustment of the film forming conditions when fabricating a zinc oxide thin film. As a film forming method, reactive sputtering is preferably used.

Boron (B) of an insulating material is segregated at the boundary of the domain of the B-doped zinc oxide thin film thus fabricated, the crystal grains constituting the zinc oxide thin film are electrically insulated from each other by this, so that the charge appearing on the surface due to piezoelectric polarization is locally strengthened and a strong electrical repulsive force is continuously maintained. In addition, the uniformity of polarization in each of the vertical direction and the lateral direction in each of the crystal grains is improved by the addition of B. As the polarization electrically isolated at a nano level is uniformly distributed on the surface of the film in this manner, the friction in a nanometer order decreases even when minute contact points in a nanometer order move on the surface so as to move from one crystal grain to another adjacent crystal grain since a change in electrical repulsive force due to polarization is small. In addition, the polarization in the lateral direction may be smaller than the polarization in the vertical direction, but the friction decreasing effect is hardly observed when the piezoelectric polarization in the vertical direction does not occur.

In Examples to be described later, the measurement of piezoelectric polarization in the vertical direction and the lateral direction of the B-undoped zinc oxide thin film and the B-doped zinc oxide thin film was performed by using a piezo-response force microscope (PFM) to apply a voltage to the film surface by a probe having a significantly small tip such as a scanning microscope (SPM) and to measure the deformation (length of elongation and contraction) appearing at the point at which a voltage is applied by an inverse piezo effect. Incidentally, in PFM, the lateral deformation is directly observed as lateral torsional deformation of the probe, but the conversion thereof to the length is easy.

In addition, the measurement of friction in nanometer order was performed by using a lateral force microscope (also called a friction force microscope, hereinafter referred to as LFM) which has the same configuration as the contact mode atomic force microscope (AFM) and observes the torsion generated when the probe is slid. In the measurement by LFM, the friction is evaluated by applying a load of about several nN to several hundreds of nN using a probe having a probe diameter of about from 20 to 40 nm. Here, the sliding distance of the probe can be variously set depending on the application, from about 50 nm to 150 μm. In the following Examples, the sliding distance was set to 2 μm. It is sufficient to set the sliding distance of the probe to about 2 μm at the time of measurement by LFM for the measurement of the friction in a nanometer order (namely, the friction in the region having a size of less than 1 μm).

EXAMPLES

Hereinafter, the present invention will be described in more detail with reference to Examples. It should be noted that the following Examples are only illustrative, and the present invention is not limited to these Examples but is specified by the provision of the claims. For example, in the following Examples, only a case in which a B-doped zinc oxide thin film is formed on a stainless steel SUS440C substrate is described, but it is needless to say that the film can be actually formed on an arbitrary substrate required to exhibit decreased friction.

In Examples to be described below, a mirror-polished SUS440C stainless steel plate (Ra=10 nm) was used as a substrate, and this substrate was first subjected to ultrasonic cleaning in high purity acetone. The substrate after the ultrasonic cleaning was fixed on a sample holder substrate of a combinatorial sputter coating system uniquely developed by the inventors of the present invention, vacuum evacuation was conducted until the base pressure reached $5.0 \times 10^{-5}$ Pa or less, and coating was then started to fabricated a zinc oxide thin film or a zinc oxide thin film to which B was doped on a substrate by a reactive sputtering process in which zinc was sputter-evaporated in an oxygen atmosphere. The distance between the target and the sample was set to 55 mm.

Figure 1:
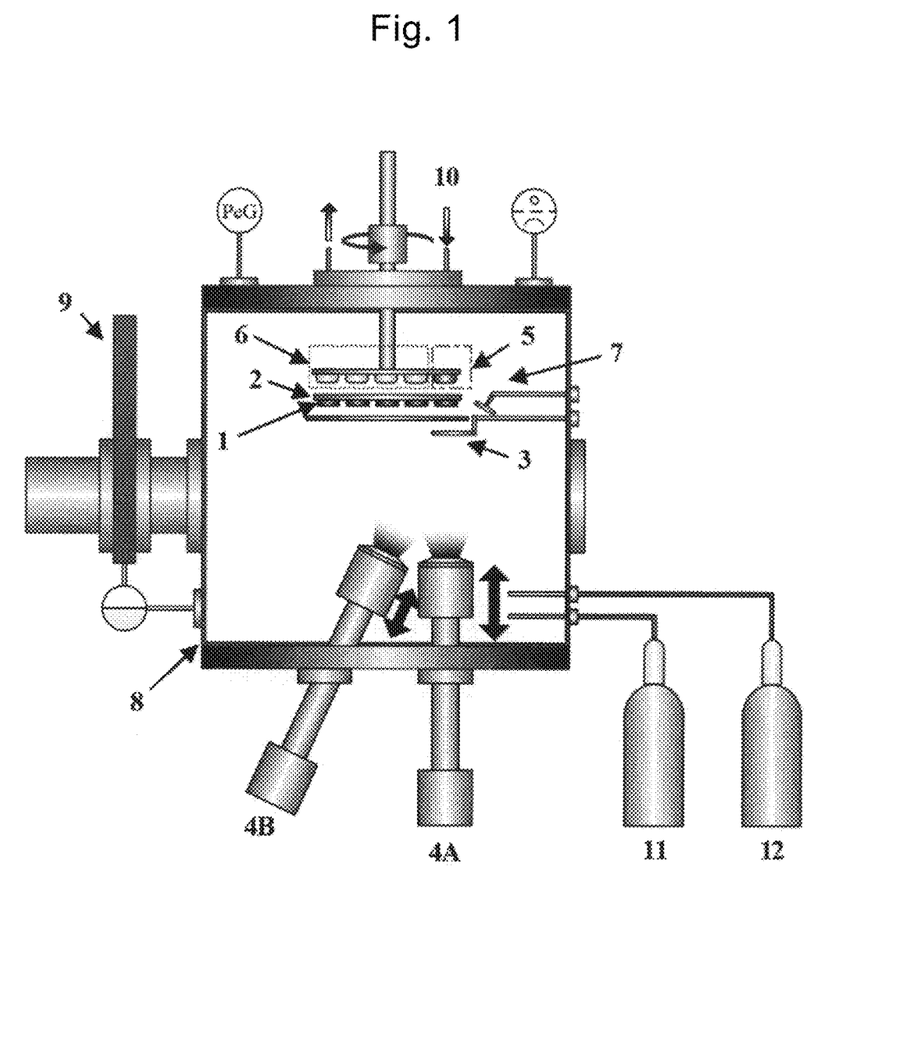
FIG. 1 is a diagram conceptually illustrating a configuration of a combinatorial sputter coating system used for fabricating a B-undoped zinc oxide thin film and a B-doped zinc oxide thin film in Examples of the present invention.

A conceptual diagram of the structure of the combinatorial sputter coating system used is illustrated in FIG. 1. In the structure illustrated in FIG. 1, a heater unit 5 for heating a substrate 1, a cooling unit 6 for cooling the substrate 1, and a quartz crystal microbalance 7 for monitoring the film thickness of the sputtered thin film on the substrate 1 and the like are disposed in a vacuum chamber 8 together with a holder 2 for holding the substrate 1, a shutter 3, a magnetron sputtering source 4 (4A and 4B). A control gate valve 9 is disposed in a passage to a vacuum pump (T.M.P+R.P.) for evacuating the interior of the vacuum chamber 8. In addition, in the example of FIG. 1, the circulation of the cooling water 10 and the supply of an inert gas Ar 11 and a reaction gas 12 are also illustrated. In this sputtering system, the substrate 1 held by the holder 2 is rotated by a rotating means. Here, two pairs of magnetron sputtering sources 4 are illustrated in FIG. 1. Zn and B are attached to the magnetron sputtering sources 4A and 4B, respectively. Incidentally, in the examples of B: 80 W and B: 120 W when fabricating a B-doped zinc oxide thin film to be described later, B was also used as a target in addition to Zn, and these two kinds of targets were attached to the respective magnetron sputtering sources and simultaneously sputtered. Incidentally, combinatorial sputter coating systems themselves and the methods of using them and the use cases of them are well known in the prior art, thus specific description thereon is omitted here, but it is possible to see, for example, Non Patent Literatures 2, 4, and 5 if necessary.

For the measurement of the coefficient of friction (μ), a load fluctuation type friction and wear testing apparatus (SHINTO Scientific Co., Ltd.) was used. The measurement conditions were set as follows. Room temperature, an atmospheric environment, partner indenter materials of SUS 304 and sapphire, a indenter material size of 3 mm an applied load of 0.1.2 N, an indenter sliding distance of 10 mm, and a sliding number of 200 times.

The evaluation results of the piezoelectric property illustrated in FIGS. 3, 4, 6, and 7 were measured by using an apparatus (model number: MFP-3D) manufactured by Oxford Asylum Research. The cantilever used together with the apparatus was OMCL-RC 800PB-1, and the probe used was SiN cantilever (spring constant of 0.82 N/m and resonance frequency of 66 Hz) coated with Au.

<Preliminary Experiment: Fabrication of B-Undoped Zinc Oxide Thin Film>

First, a zinc oxide thin film to which B was not doped was fabricated by using a combinatorial sputter coating system of which the configuration was conceptually illustrated in FIG. 1 under the film forming conditions presented in the following Table 1.

TABLE 1

| Substrate | SUS440C (surface coarseness Ra = 10 nm) |  |
|---|---|---|
| Sputtering apparatus | Combinatorial sputter coating system (COSCOS) | |
| Film forming method | Reactive sputtering method | |
| Base pressure [Pa] | $<5 \times 10^{-5}$ | |
| Sputtering gas pressure [Pa] | 0.1 | |
| | Ar | $O_2$ |
| Sputtering gas partial pressure ratio [%] | 60 | 40 |
| | 50 | 50 |
| | 40 | 60 |
| | 30 | 70 |
| | 20 | 80 |
| | 10 | 90 |
| | 0 | 100 |
| Target | Zn (99.999%) | |
| High-frequency power [W] | 100 | |
| Film thickness [μm] | 2 | |

In the combinatorial sputter coating system illustrated in FIG. 1, two pairs of magnetron sputtering sources are provided so that sputtering can be performed simultaneously from two kinds of targets. However, in this experiment, only Zn was used as a target, and a zinc oxide thin film with a thickness of 2 μm was fabricated on a stainless steel SUS 440 C substrate by reactive sputtering. Here, a mixed gas of argon (Ar) and oxygen ($O_2$) was used as the sputtering gas, and the $O_2$ partial pressure ratio was changed from 40% to 50%, 60%, 70%, 80%, 90%, and 100% to fabricate seven kinds of zinc oxide thin films. The particle size of the crystals on these films was measured to be from 40 to 60 nm.

<Fabrication of B-Doped Zinc Oxide Thin Film>

It has been found that the variation in the PFM suddenly decreases at a partial pressure ratio of about 60% and the PFM image (not illustrated) of the B-undoped zinc oxide thin film forms a uniform film as the partial pressure ratio of $O_2$ in the sputtering gas is increased. In addition, it has been confirmed that the shape of the histogram (not illustrated) is steepest when the partial pressure ratio of $O_2$ was in the range of from 60% to 80% in the histogram of measurement results by PFM. Based on the results of this preliminary experiment, the partial pressure ratio of Ar to $O_2$ in the sputtering gas was fixed at 40%: 60%. A B-doped zinc oxide thin film was fabricated by simultaneously supplying B from the B target during the fabrication of the zinc oxide thin film by the reactive sputtering performed above. The film forming conditions therefor are summarized in the following Table 2.

TABLE 2

| Substrate | SUS440C (surface coarseness Ra = 10 nm) |
|---|---|
| Sputtering apparatus | Combinatorial sputter coating system (COSCOS) |
| Film forming method | Reactive sputtering method |
| Base pressure [Pa] | <5 × 10⁻⁵ |
| Sputtering gas pressure [Pa] | 0.1 |
| | Ar | O₂ |
| Gas partial pressure ratio [%] | 40 | 60 |
| Target | Zn (99.999%) | B (99.99%) |
| High-frequency power [W] | 100 | 0, 80, 120 |
| Film thickness [μm] | 1 |

As can be seen from the above table, between the two magnetron sputtering sources illustrated in FIG. 1, the high-frequency power was switched in two ways of 80 W and 120 W on the side to which the B target was attached to change the amount of B doped while the high-frequency power was fixed at 100 W on the side to which the Zn target was attached. Incidentally, in the above table, a case in which the high-frequency power on the B target side is 0 W is also described, and this indicates that the magnetron sputtering source on the B target side is stopped in order to fabricate a sample for comparison referred to as a zinc oxide thin film to which B is not doped. Incidentally, as a result of separate measurement, the particle size of the crystal in the B-doped zinc oxide thin film was from 20 to 50 nm. In addition, the composition ratio (mass ratio) of B in the B-doped zinc oxide thin film was from 13.8% to 22.8%.

Figure 2:
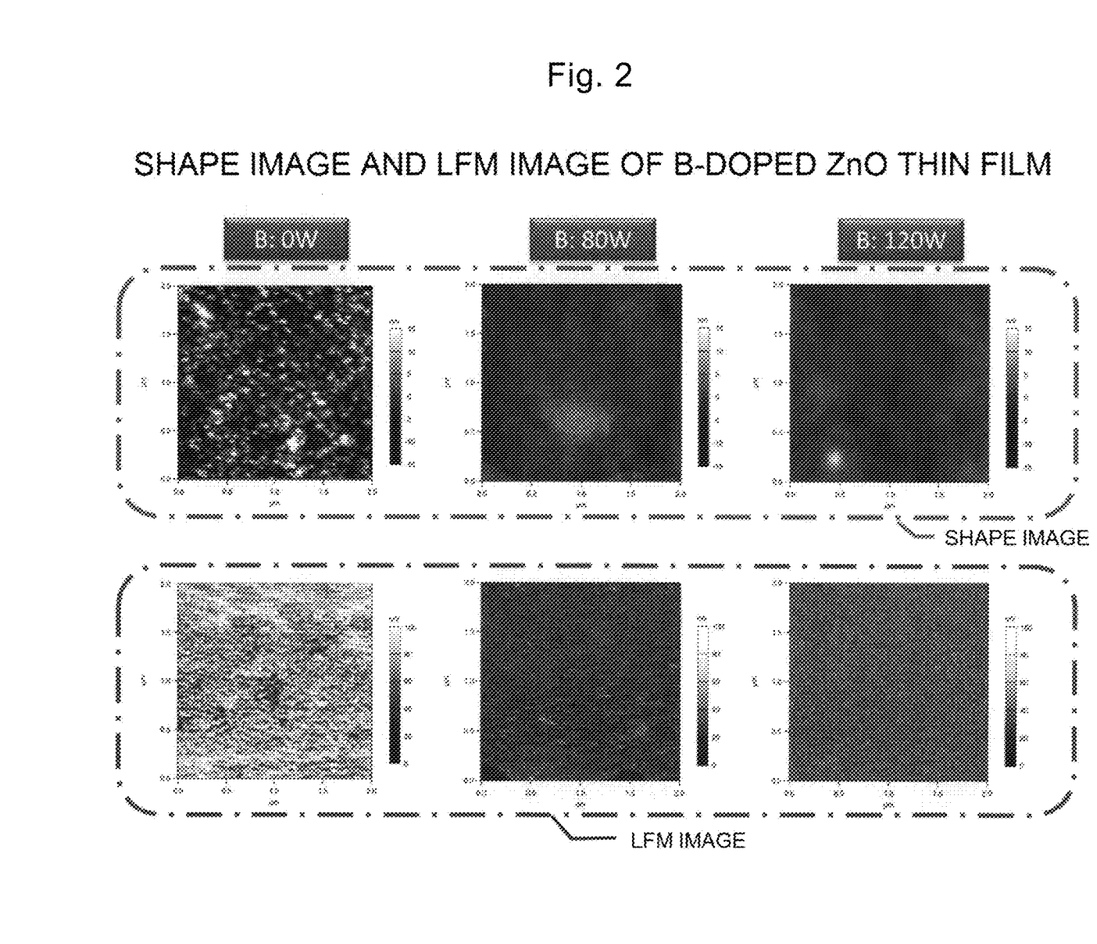
FIG. 2 is a diagram illustrating shape images and lateral force microscope (LFM) images of a B-undoped zinc oxide thin film and a B-doped zinc oxide thin film fabricated by changing a high-frequency power to a B target in three ways of 0 W, 80 W, and 120 W in Examples of the present invention.

FIG. 2 illustrates the shape images (namely, images obtained by measuring irregularities on the surfaces of the samples by AFM) and LFM images of three samples thus fabricated, namely, B: 0 W (B-undoped zinc oxide thin film) and B: 80 W and B: 120 W (thin films fabricated by setting the high-frequency power of the magnetron sputtering source on the B target side to 80 W and 120 W, respectively). Incidentally, in the present Example, the sliding distance at the time of the measurement by LFM was set to 2 μm. As can be seen from FIG. 2, in B: 0 W (B-undoped zinc oxide thin film), irregularities having a lateral size of about 100 nm to several tens of nm and a height much higher than 10 nm are distributed all over the surface and the friction in a nanometer order is also at a considerably high level on average as well as the LFM image also has a similar granular pattern reflecting the presence of such irregularities in a nanometer order. Here, the individual irregularities are considered to correspond to the domains. This has been confirmed from the fact that the thickness of the column of the columnar structure and the size of these irregularities are in agreement as a result of cross-sectional measurement (not illustrated) of some samples by TEM. On the other hand, clear irregularities as in the sample of B: 0 W are not present in the shape images of the samples of B: 80 W and B: 120 W which are B-doped zinc oxide thin films and the LFM images also indicate that the friction is significantly and uniformly low over the entire surface.

Figure 3:
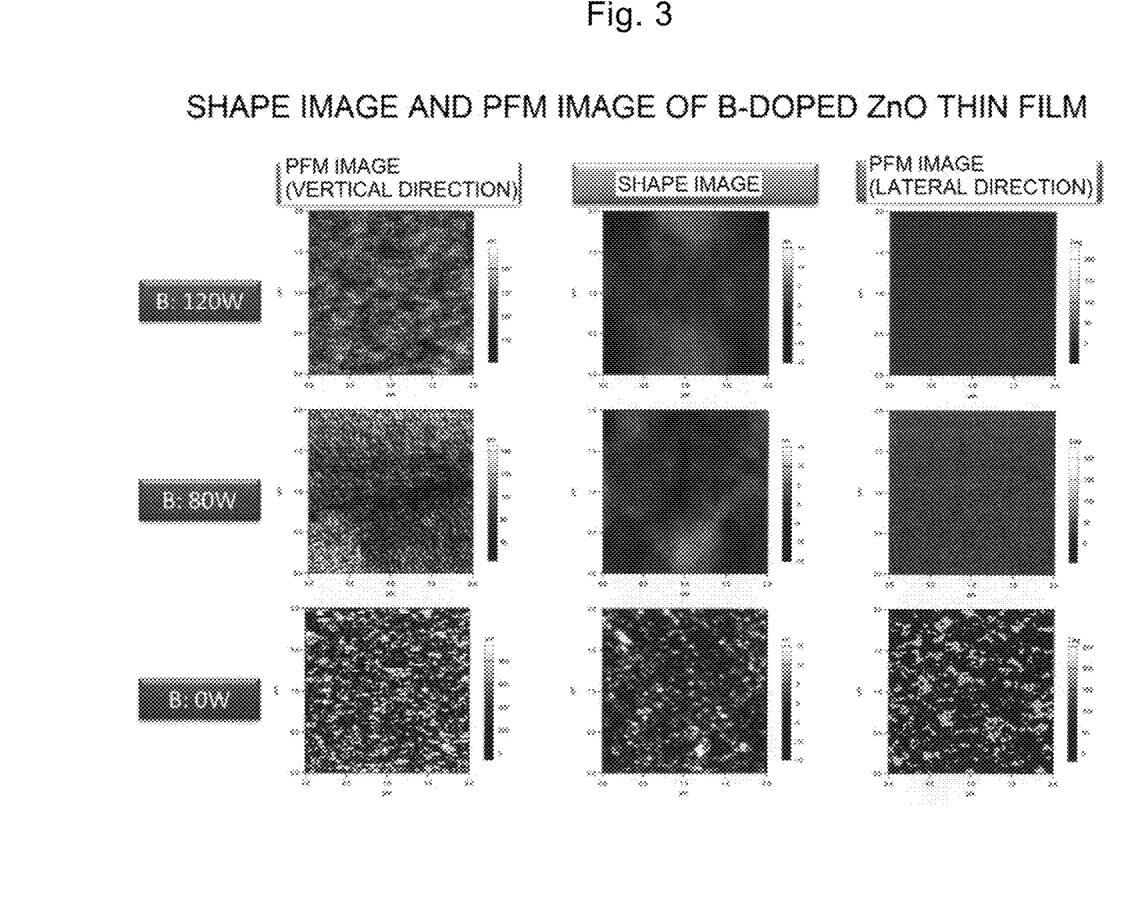
FIG. 3 is a diagram illustrating shape images and vertical and lateral piezo-response force microscope (PFM) images of the same B-undoped zinc oxide thin film and B-doped zinc oxide thin film as in FIG. 2.

Next, as illustrated in FIG. 3, lateral and vertical PFM images and shape images of these three kinds of samples were compared to one another. By this comparison as well, the B-undoped zinc oxide thin film showed great variations corresponding to the shape and size of the irregularities of the shape image in both the vertical PFM and the lateral PFM but the B-doped zinc oxide thin films both showed smaller variations in the vertical and lateral PFM as compared to the B-undoped zinc oxide thin film. Incidentally, here, it should be noted that the lateral PFM shows a small value but it is a finite value which is not 0.

Figure 4:
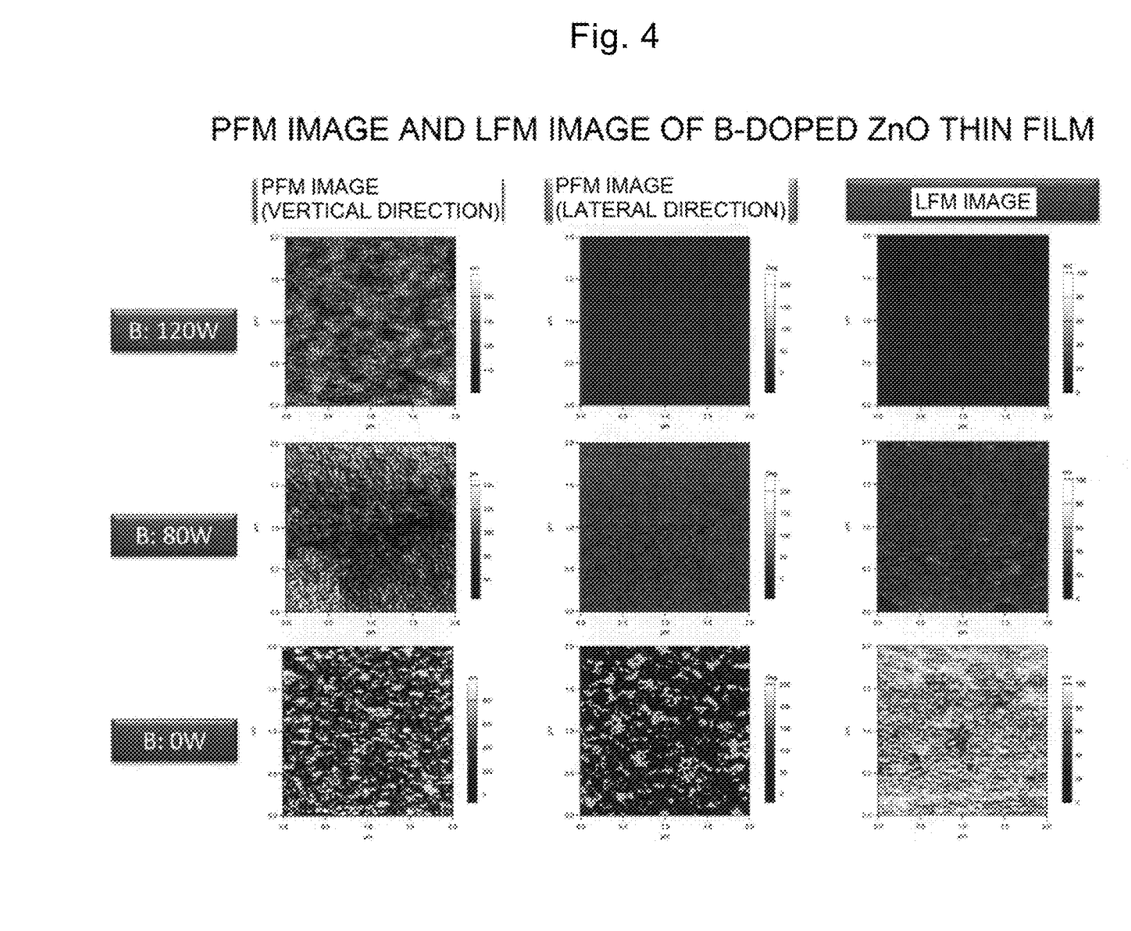
FIG. 4 is a diagram illustrating vertical and lateral PFM images and LFM images of the same B-undoped zinc oxide thin film and B-doped zinc oxide thin film as in FIG. 2.

FIG. 4 illustrates comparison of the vertical and lateral PFM images and LFM images of these three kinds of samples to one another. As is clear from this comparison as well, it can be seen that the B-undoped zinc oxide thin film shows great variations corresponding to the irregularities on the surface shown in the shape image of FIG. 3 and the like in both the vertical and lateral PFM, and correspondingly, friction at a high level is observed on the LFM image as well to correspond to the shape image. On the other hand, the two samples of the B-doped zinc oxide thin films both show vertical and lateral PFM images with little variations, and correspondingly the LFM images also show uniform and low friction.

Figure 5:
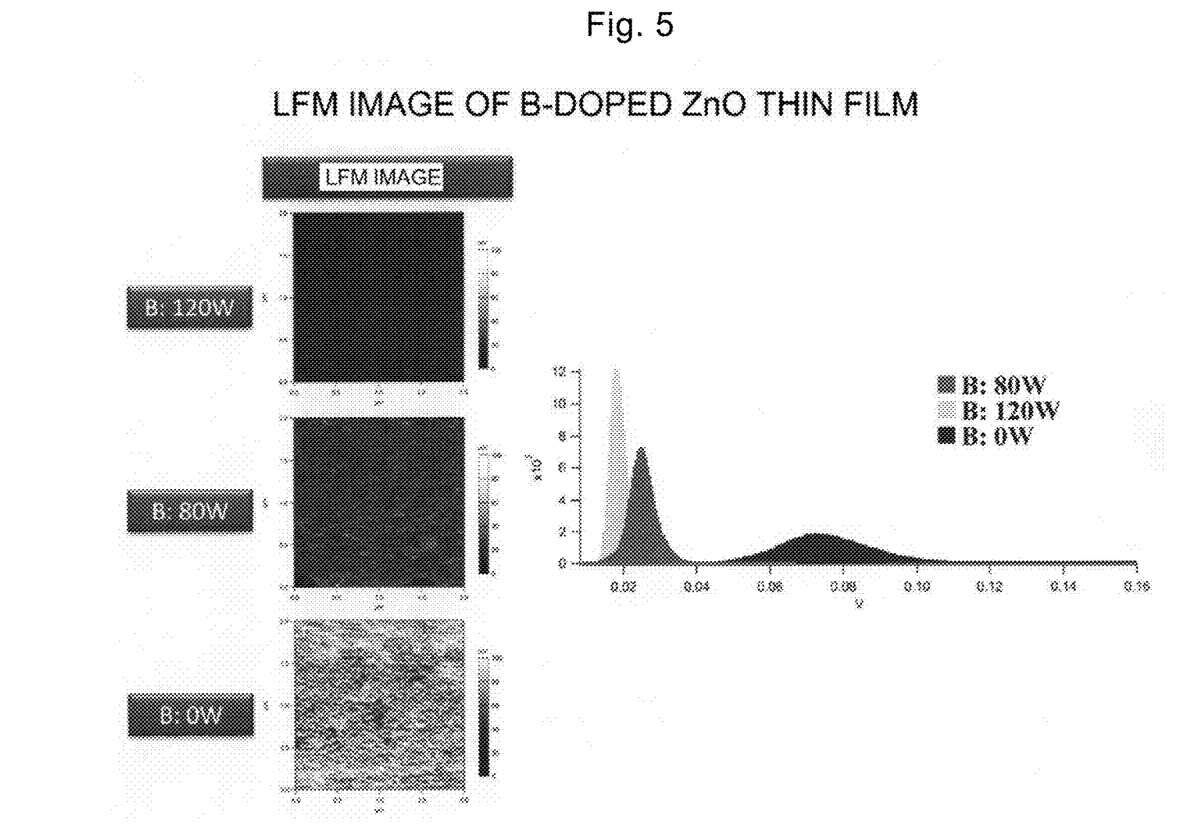
FIG. 5 is a diagram illustrating LFM images of the same B-undoped zinc oxide thin film and B-doped zinc oxide thin film as in FIG. 2 and the frequency distribution of values measured by LFM for each of the B-undoped zinc oxide thin film and the B-doped zinc oxide thin film.
Figure 6:
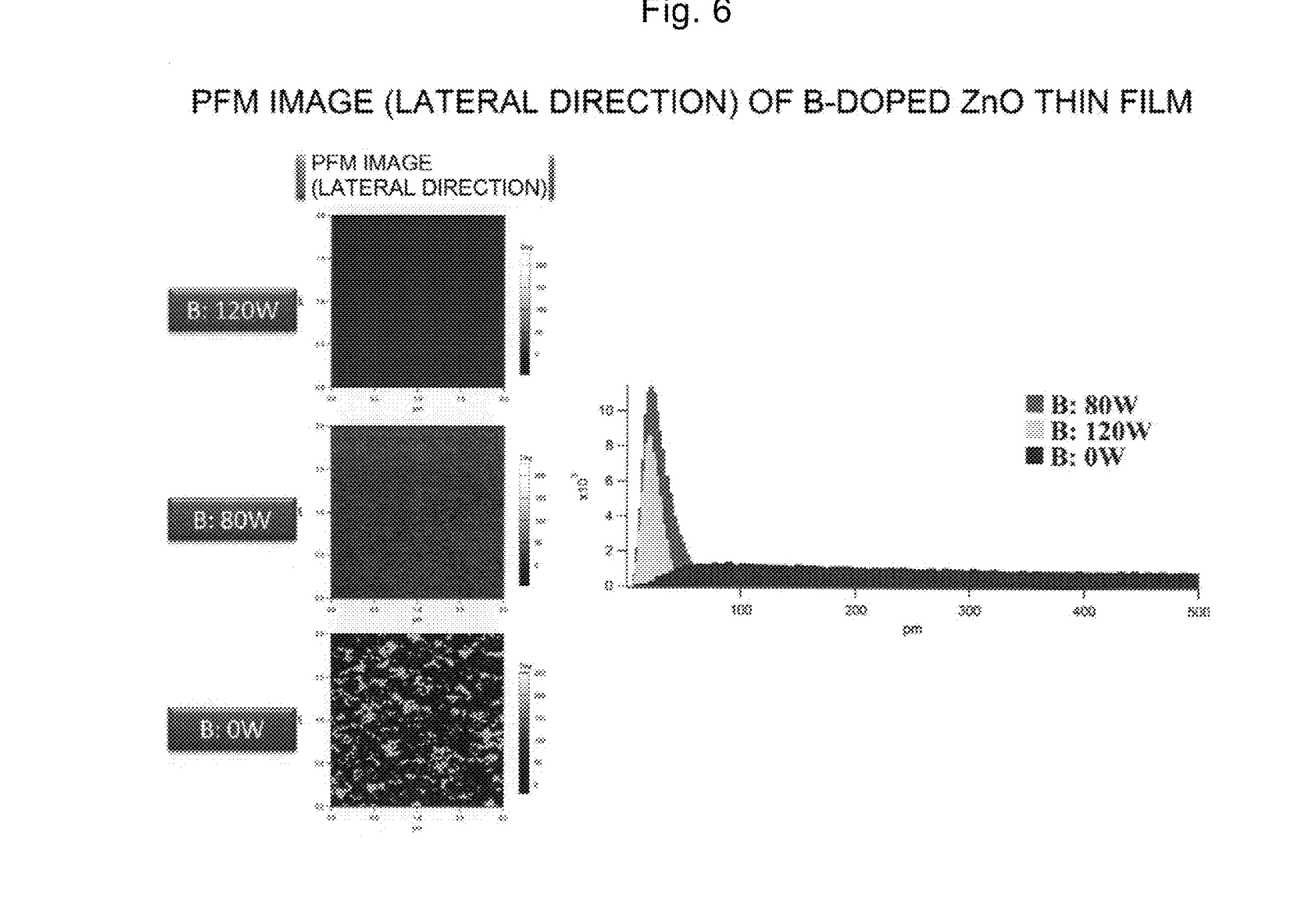
FIG. 6 is a diagram illustrating lateral PFM images and the frequency distribution of values measured by lateral PFM of the same B-undoped zinc oxide thin film and B-doped zinc oxide thin film as in FIG. 2.
Figure 7:
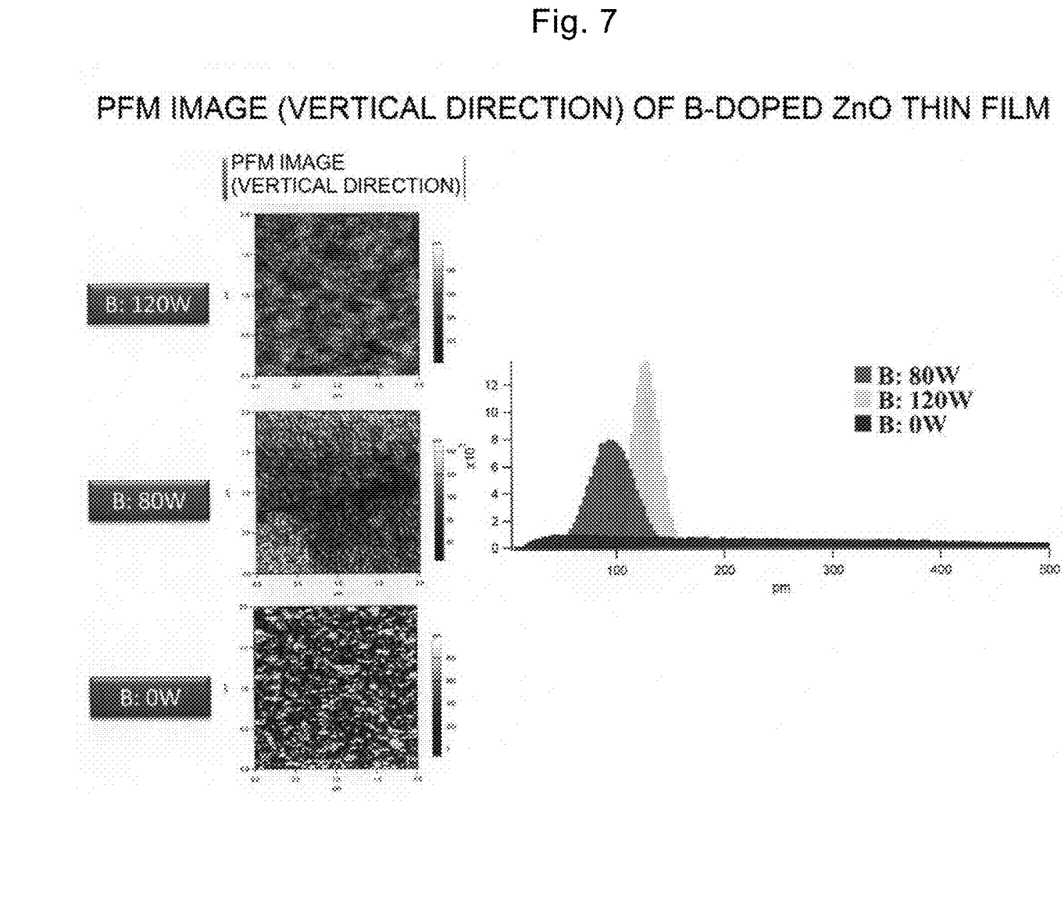
FIG. 7 is a diagram illustrating vertical PFM images and the frequency distribution of values measured by vertical PFM of the same B-undoped zinc oxide thin film and B-doped zinc oxide thin film as in FIG. 2.

Next, in order to more clearly show the magnitudes and variations of the measurement results of these three kinds of samples by LFM, a distribution diagram of the measurement results by LFM was created. The LFM images of three kinds of samples are illustrated on the left side in FIG. 5, and the distribution diagram of these measurement results by LFM is illustrated on the right side in FIG. 5. In this distribution diagram, the horizontal axis represents the voltage which is the reading value of the measurement by LFM (note that the magnitude of torsion of the probe is read as voltage here. In other words, it indicates that the torsion of the probe at the time of sliding is greater and eventually the friction is greater as the voltage is greater) and the vertical axis represents the frequency by which each voltage is read. As can be readily seen from this distribution diagram, friction is greatly observed over the entire surface of the B-undoped zinc oxide thin film and the magnitude of friction varies over a wide range. On the other hand, friction is slightly observed over the entire surface of the B-doped zinc oxide thin films and the variations are also in both samples, that is, the films are in a uniform low friction state.

Next, a distribution diagram clearly illustrating the magnitudes and variations of the measurement results of these three kinds of samples by lateral PFM was created. The lateral PFM images of the three kinds of samples are illustrated on the left side in FIG. 6, and the distribution diagram of these measurement results by PFM are illustrated on the right side in FIG. 6. In this distribution diagram, the horizontal axis represents the length of the reading value in measurement by PFM in pm and the vertical axis represents the frequency by which each length is read. As can be readily seen from this distribution diagram, the B-undoped zinc oxide thin film varies in a significantly wide range over the entire surface in the vertical PFM. On the other hand, in the B-doped zinc oxide thin films, it is indicated that the measurement results by PFM are not 0 but the value is small and the variations are small over the entire surface in both samples.

Finally, a distribution diagram clearly illustrating the magnitudes and variations of the measurement results of these three kinds of samples by vertical PFM was created. The vertical PFM images of three kinds of samples are illustrated on the left side in FIG. 7 and the distribution diagram of these measurement results by PFM are illustrated on the right side in FIG. 7. In this distribution diagram, the horizontal axis represents the length of the reading value in measurement by PFM in pm and the vertical axis represents the frequency by which each length is read. As can be readily seen from this distribution diagram as well, the B-undoped zinc oxide thin film varies in a significantly wide range over the entire surface in the vertical PFM in exactly the same manner as in the case of the lateral PFM. On the other hand, in the B-doped zinc oxide thin films, the measurement results by PFM are concentrated in a narrow range over the entire surface although they are slightly greater than in the case of the lateral PFM in both samples, that is, it indicates that the variations are small.

From the above results, it can be seen that in the B-doped zinc oxide thin film, the friction at a nanometer level represented by the measurement results by LFM decreases when the magnitude of piezoelectric polarization in the vertical direction is within 150 pm and the magnitude of piezoelectric polarization in the lateral direction is within 100 pm at 90% or more of the measurement points. A decrease in the magnitude and variations of polarization in the vertical and lateral PFM satisfying this condition is realized, for example, by appropriately doping B at the time of fabricating the zinc oxide thin film.

INDUSTRIAL APPLICABILITY

According to the present invention, as can be seen from the LFM image of Examples, it is possible to realize coating exhibiting significantly low friction in a nanometer order, and the coating is thus expected to be used extensively, for example, for micromechanical members in micromachines having significantly minute contact surfaces (the size of the contact region between a movable member and another member in contact with this member is about from 1 nm to 200 μm).

REFERENCE SIGNS LIST

1 Substrate
2 Holder
3 Shutter
4 (4A and 4B) Magnetron sputter source
5 Heater unit
6 Cooling unit
7 Quartz crystal microbalance
8 Vacuum Tank
9 Control gate valve
10 Cooling water
11 Ar
12 Reaction gas

The invention claimed is:

1. Low friction coating consisting of a boron-doped zinc oxide thin film, wherein piezoelectric polarization in a vertical direction perpendicular to a surface of the film and a lateral direction horizontal to the surface of the film occurs and a magnitude of the piezoelectric polarization in the vertical direction is not more than 150 pm and a magnitude of the piezoelectric polarization in the lateral direction is not more than 100 pm at 90% or more of measurement points.

2. A micromachine, wherein the low friction coating according to claim 1 is applied to at least either of a movable member and another member in contact with the movable member.

3. The micromachine according to claim 2, wherein a size of a region in which the movable member and the other member are in contact is from 1 nm to 200 μm.

* * * * *